United States Patent
Peng et al.

[11] Patent Number: 6,129,108
[45] Date of Patent: Oct. 10, 2000

[54] FLUID DELIVERING SYSTEM

[75] Inventors: Yu-Feng Peng, Chiayi Hsien; Ming-Fa Liu, Changhua Hsien; Morris Chang, Hisnchu; Mike Hou, Changhua Hsien, all of Taiwan

[73] Assignees: United Semiconductor Corp; United Microelectronics Corp, both of Hsinchu, Taiwan

[21] Appl. No.: 09/454,261

[22] Filed: Dec. 3, 1999

[51] Int. Cl.[7] .................................... F16K 49/00
[52] U.S. Cl. .................. 137/334; 137/341; 137/565.37; 137/557; 137/883; 118/728
[58] Field of Search .................. 137/334, 341, 137/565.37, 565.23, 557, 883; 118/620, 728

[56] References Cited

U.S. PATENT DOCUMENTS

| | | | |
|---|---|---|---|
| 4,971,100 | 11/1990 | Ohmi | 137/334 |
| 5,040,046 | 8/1991 | Chhabra et al. | |
| 5,054,519 | 10/1991 | Berman | 137/563 |
| 5,240,024 | 8/1993 | Moore et al. | 137/38 |
| 5,252,134 | 10/1993 | Stauffer | 118/726 |
| 5,455,014 | 10/1995 | Costantino et al. | |
| 5,469,885 | 11/1995 | Nishimura | 137/568 |
| 5,488,967 | 2/1996 | Minami et al. | 137/565.23 |
| 5,915,414 | 6/1999 | Seaman et al. | 137/883 |

*Primary Examiner*—A. Michael Chambers
*Attorney, Agent, or Firm*—J.C.Patents; Jiawei Huang

[57] ABSTRACT

A fluid delivering system receives a fluid from a supplying device, transfers the fluid to an operational device and then dumps the used fluid into an extraction device. The fluid delivering system has a main pipeline system and at least a secondary pipeline system. Each pipeline system uses a first flow valve to control the back flow of fluid to a first flow controller, a second flow valve to protect a pressure gauge and a third flow valve to control the flow of fluid to a pressure controller. Through the relative positioning and the concerted actions of these three valves, any malfunctioning in the fluid delivering system can be detected quickly so that on-going processing operation can stop immediately to minimize product damages.

6 Claims, 2 Drawing Sheets

FLUID DELIVERING SYSTEM

BACKGROUND OF THE INVENTION

1. Field of the Invention

The present invention relates to a fluid delivering system. More particularly, the present invention relates to an improved version of the fluid delivering system Unity 85DP provided by TEL Corporation, which system is capable of sensing abnormal pressure buildup inside its pipeline and terminating a current processing operation.

2. Description of the Related Art

In the manufacturing of semiconductors, many processing operations require the supply of gases to the processing chambers. For example, gases such as $SiH_4$, $B_2H_6$, $NH_3$ and $H_2$ are needed in chemical vapor deposition; gases such as $CF_4$, $CHF_3$, $O_2$ and $SF_6$ are needed in dry etching, and inert gases are used in various types of equipment and measuring instruments. Therefore, an independent gaseous dispensing system is often needed to deliver the processing gases. Since the properties of gases vary over a wide spectrum, the designs of gas delivering systems also range from simple to complex.

FIG. 1 is a schematic diagram showing a Unity 85DP pipeline system by TEL Corporation for delivering helium. As shown in FIG. 1, the pipeline system 10 is connected to a supply device 12, an operational device 14 and an extraction device 16. The pipeline system 10 includes a main pipeline system 18 and at least a secondary pipeline system (here, only a secondary pipeline system 20 is shown). First, a gas (for example, helium) is forwarded by the supply device 12 into the pipeline system 10. After passing through the main pipeline system 18 and the secondary pipeline system 20, the gas is delivered to the operational device 14. The operational device 14, for example, can be placed next to the lower electrode (ESC) inside a processing chamber so that a back surface of a silicon chip can be cooled by the gaseous helium. Finally, the gaseous helium is channeled away via the extraction device 16, which is, for example, a pump.

The main pipeline system 18 comprises a first flow valve 22, a first flow controller 24, a first pressure gauge 26, a second flow valve 28, a third flow valve 30, a fourth flow valve 32, a first pressure controller 34 and a fifth flow valve 36. Similarly, the secondary pipeline system 20 comprises a sixth flow valve 38, a second flow controller 40, a second pressure gauge 42, a seventh flow valve 44, an eighth flow valve 46, a ninth flow valve 48, a second pressure controller 50 and a tenth flow valve 52.

On entering the pipeline system 10, helium from the supply device 12 first arrives at the first flow valve 22 and the sixth flow valve 38. The helium then moves on to the first flow controller 24 and the second flow controller 40 along separate paths. The helium next moves on to the second flow valve 28 and the seventh flow valve 44, and then enters the operational device 14 next to the lower electrode for cooling the back surface of a silicon chip. The third flow valve 30 and the eighth flow valve 46 are connected to a point between the operational device 14 and the second flow valve 28 and between the operational device 14 and the seventh flow valve 44, respectively. The third and the eighth flow valve 30 and 46 are connected to an external pipeline, which serves as a standby system. In general, the standby system is unused if supporting software programs are unavailable. The first pressure gauge 26 and the second pressure gauge 42 are attached to a point between the first flow controller 24 and the second flow valve 28 and a point between the second flow controller 40 and the seventh flow valve 44, respectively. The pressure gauges 26 and 42 are used for detecting any variation in helium pressure inside the pipeline. The first pressure controller 34 and the second pressure controller 50 are used to control helium pressure inside the pipeline. The fourth flow valve 32 is connected to the second flow valve 28, the first flow controller 24, the first pressure gauge 26 and the first pressure controller 34. Similarly, the ninth flow valve 48 is connected to the seventh flow valve 44, the second flow controller 40, the second pressure gauge 42 and the second pressure controller 50. The fourth flow valve 32 and the ninth flow valve 48 are used for controlling the flow of helium to the first pressure controller 34 and the second pressure controller 50, respectively. Finally, output of helium to the extraction device 16 is controlled by the fifth flow valve 36 (connected to the first pressure controller 34) and the tenth flow valve 52 (connected to the second pressure controller 50), respectively.

The first pressure gauge 26 and the second pressure gauge 42 are separated from the operational device 14 by the second flow valve 28 and the seventh flow valve 77, respectively. Furthermore, the second flow valve 28 and the fourth flow valve 32 form a group while the seventh flow valve 44 and the ninth flow valve 48 form another group. The valves in each group open and close together so that a normal flow of helium can be maintained inside the pipeline. However, when the fourth flow valve 32 and the ninth flow valve 48 malfunction, the helium dumping loop is blocked. Hence, the fluid delivering system will trip due to the buildup of excess internal pressure. Similarly, malfunction in other pipeline components can be detected by the pressure gauges 26 and 42.

If the second flow valve 28 and the seventh flow valve 44 malfunction, helium supply to the operation device 14 will be cut. Consequently, the back surface of the silicon wafer will overheat, possibly leading to material burnt-out. However, the helium loop (for example, the main system pipeline 18) from the supply device 12 to the first flow valve 22, the first flow controller 24, the fourth flow valve 32, the first pressure controller 34 and the fifth flow valve 36 will remain open. Therefore, the first pressure gauge 26 or any other sensor installed along this helium loop will be unable to detect any abnormality. Since no abnormality in the helium pipeline is detected, no malfunctioning signals will be issued to terminate the current processing operation, even when no cooling helium is delivered to the back surface of the silicon wafer.

SUMMARY OF THE INVENTION

The invention provides a fluid delivering system. The fluid delivering system is coupled to a supply device, an operational device and an extraction device. The fluid delivering system includes a main pipeline system and at least a secondary pipeline system. A fluid is fed into the main pipeline system from the supply device. The fluid is carried along the main pipeline system to the operational device so as to conduct a reaction. After servicing the particular reaction, the fluid is exhausted from the operational device by the extraction device. Similarly, every secondary pipeline system receives a fluid from the supply device and transfers the fluid to the operational device so as to carry out a reaction. Fluid in the operational device is exhausted by the extraction device.

The main pipeline system comprises a first flow valve connected to the supply device for controlling the inflow of fluid; a first flow controller connected to the first flow valve for controlling volumetric flow through the pipeline; a second flow valve connected to the first flow controller and the operational device for controlling the amount of back flow; a first pressure gauge for detecting the variation of pressure of fluid inside the pipeline; a third flow valve connected to the second flow valve, the first pressure gauge and the operational device for protecting the pressure gauge; a first pressure controller for controlling fluid pressure; a fourth flow valve connected to the second flow valve, the third flow valve, the operational device and the first pressure controller for controlling the amount of fluid to the first pressure controller; and a fifth flow valve connected to the first pressure controller and the extraction device for controlling fluid output to the extraction device.

Each secondary pipeline system comprises a sixth flow valve connected to the supply device for controlling the inflow of fluid; a second flow controller connected to the sixth flow valve for controlling volumetric flow through the pipeline; a seventh flow valve connected to the second flow controller and the operational device for controlling the amount of back flow; a second pressure gauge for detecting the variation of pressure of fluid inside the pipeline; an eighth flow valve connected to the seventh flow valve, the second pressure gauge and the operational device for protecting the pressure gauge; a second pressure controller for controlling fluid pressure; a ninth flow valve connected to the seventh flow valve, the eighth flow valve, the operational device and the second pressure controller for controlling the amount of fluid to the second pressure controller; and a tenth flow valve connected to the second pressure controller and the extraction device for controlling fluid output to the extraction device.

The fluid delivering system is capable not only of delivering a gaseous fluid (such as an inert gas or helium), but also of delivering a liquid to the operational device. By moving the original flow valve so that the pressure gauge is connected to the operational device, pressure of helium under the silicon wafer can be detected more directly. Furthermore, by placing an unused flow valve before the pressure gauge, the pressure gauge is protected against direct contact with the atmosphere.

Accordingly, the present invention provides a fluid delivering system capable of preventing product damage due to undetected valve malfunction or pipeline leakage somewhere along a helium pipeline system.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
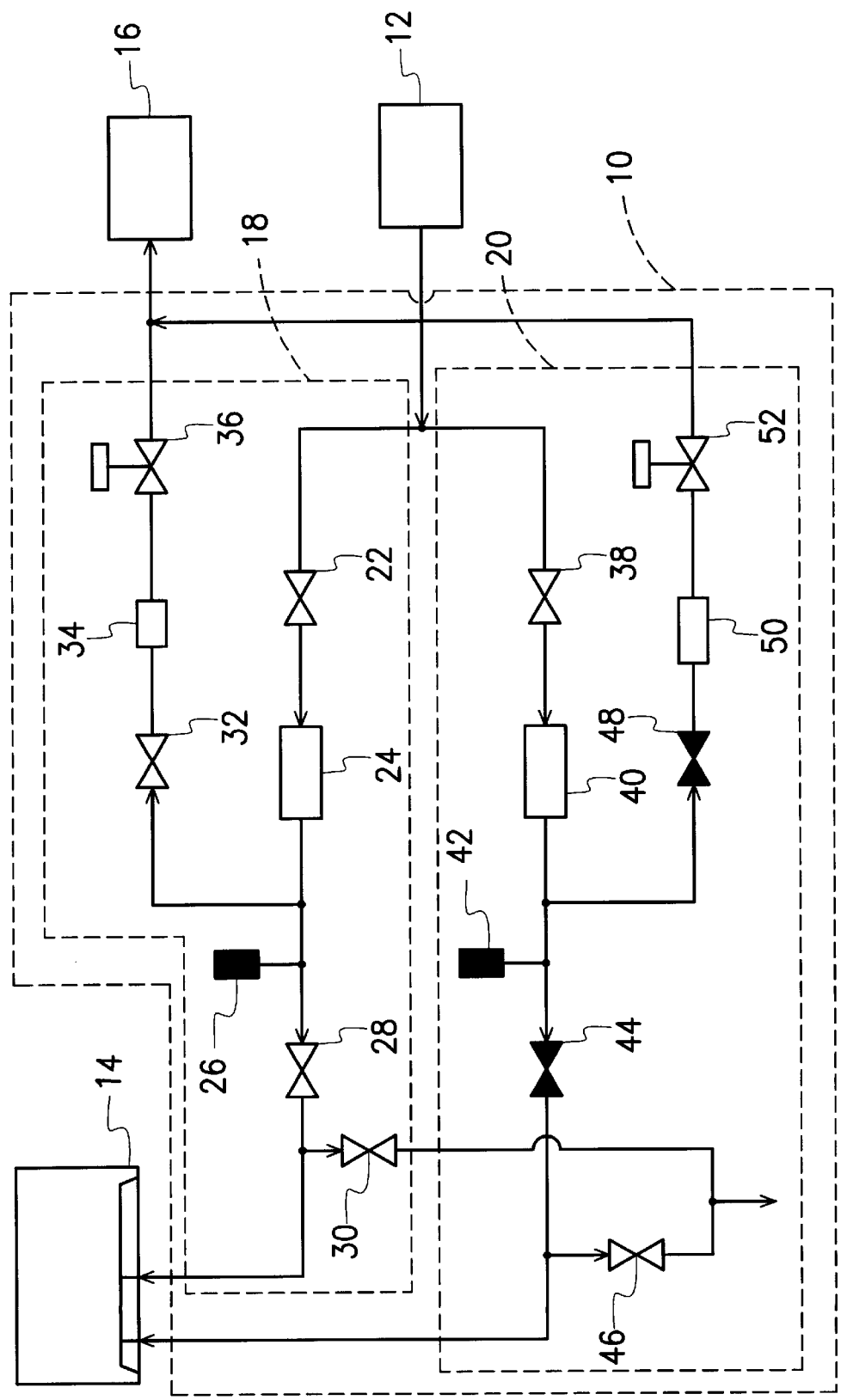
FIG. 1 is a schematic diagram showing a Unity 85DP pipeline system by TEL Corporation for delivering helium.

Reference will now be made in detail to the present preferred embodiments of the invention, examples of which are illustrated in the accompanying drawings.

Wherever possible, the same reference numbers are used in the drawings and the description to refer to the same or like parts.

Figure 2:
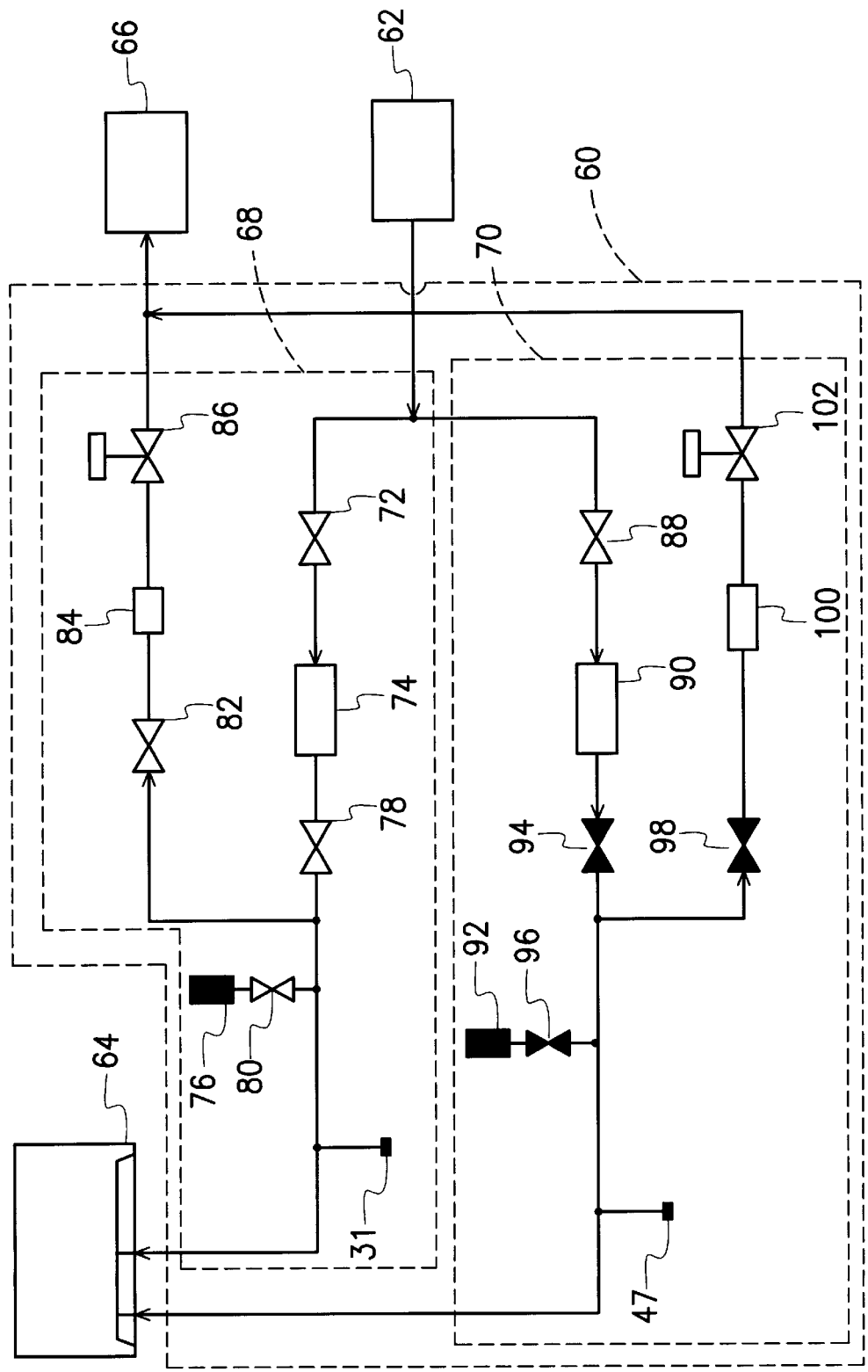
FIG. 2 is a schematic diagram showing a fluid delivering system according to a first preferred embodiment of the invention.

FIG. 2 is a schematic diagram showing a fluid delivering system according to a first preferred embodiment of the invention.

As shown in FIG. 2, the fluid delivering system 60 of this invention is coupled to a supply device 62, an operational device 64 and an extraction device 66, respectively. The fluid delivering system 60 comprises a main pipeline system 68 and at least a secondary pipeline system (in FIG. 2, only one secondary pipeline system 70 is shown).

First, a fluid (for example, helium) is supplied from the supply device 72 to the liquid delivering system 60. After passing through the main pipeline system 68 and the secondary pipeline system 70, the helium is forwarded to the operational device 64. The operational device 74 is typically located next to a lower electrode (ESC) inside a processing chamber. The helium emitted from the operational device is used for cooling the back surface of a silicon wafer so that overheating of silicon material is prevented. After servicing the silicon wafer, the heated helium is removed from the processing chamber by the extraction device 66, which is a helium pump, for example.

The main pipeline system 68 includes a first flow valve 72, a first flow controller 74, a first pressure gauge 76, a second flow valve 78, a third flow valve 80, a fourth flow valve 82, a first pressure controller 84 and a fifth flow valve 86. The secondary pipeline system 70 includes a sixth flow valve 88, a second flow controller 90, a second gauge pressure 92, a seventh flow valve 94, an eighth flow valve 96, a ninth flow valve 98, a second pressure controller 100 and a tenth flow valve 102.

Helium from the supply device 62 first enters the fluid delivering system 60 and diverges along two pathways. One pathway enters the main pipeline system 68 while the other enters the secondary pipeline system 70. Helium passes through the first flow valve 72 and the sixth flow valve 88 and then the first flow controller 74 and the second flow controller 90, respectively. Helium enters the second flow valve 78 and the seventh flow valve 94, which are valves for controlling helium feedback. Finally, helium is delivered to the operational device 14 next to the lower electrode inside a processing chamber for cooling the back surface of a silicon wafer. The third flow valve 30 and the eighth flow valve 46 as shown in FIG. 1 are sealed off (corresponding to valves 31 and 47 of FIG. 2). The first pressure gauge 76 and the second pressure gauge 92 are directly connected to the operational device 64 inside the processing chamber via the third flow valve 80 and the eighth flow valve 96, respectively. Hence, helium pressure inside the processing chamber can be directly measured. The third flow valve 80 and the eighth flow valve 96 are capable of protecting the pressure gauges 76 and 92 against direct contact with the atmosphere. The first pressure controller 84 and the second pressure controller 100 are used for controlling helium pressure inside the respective pipeline systems 68 and 70. The fourth flow valve 82 is connected to the second flow valve 78, the third flow valve 80, the operational device 64 and the first pressure controller 84 for controlling pressure to the first pressure controller 84. Similarly, the ninth flow valve 98 is connected to the seventh flow valve 94, the eighth flow valve 96, the operational device 64 and the second pressure controller 100 for controlling pressure to the first pressure controller 100. Finally, helium is removed from the first pressure controller 84 and the second pressure controller 100 to the extraction device 66 via the fifth flow valve 86 and the tenth flow valve 102, respectively.

In the main pipeline system 68, the second flow valve 78, the third flow valve 80 and the fourth flow valve 82 together form a group. Similarly, in the secondary pipeline system 70, the seventh flow valve 94, the eighth flow valve 96 and the ninth flow valve 98 together form another group. All the valves within the same group open or close simultaneously so that a normal flow of helium is maintained within the respective pipeline systems 68 and 70. If the fourth flow valve 82 or the ninth flow valve 98 suddenly malfunction, helium can no longer be expelled from the system because the helium dumping loop is blocked. The subsequent pressure buildup inside the pipeline trips the delivering system and sends a signal to the operational device 64. On receiving the signal, the operational device 64 stops any operation currently being conducted inside the processing chamber and hence the silicon wafer will not be overheated due a shortage of fresh helium. If the second flow valve 78 or the seventh flow valve 94 suddenly malfunctions, no fresh helium is supplied to the operational device 64 because the source loop of helium is now blocked. The sudden reduction of helium flow through the flow controller 74 or 90 produces a signal tripping the delivering system and sending a signal to the operational device 64. Any operation currently being conducted inside the processing chamber stops on receiving the signal. Finally, if the third flow valve 80 or the eighth flow valve 96 suddenly malfunctions, the sudden change in pressure detected by the first or second pressure gauge 76 or 92 can initiate a signal for tripping the delivering system. Malfunctions in other parts of the delivering system can similarly be detected by the first pressure gauge 76 and the second pressure gauge 92.

In summary, the fluid delivering system of this invention is an improved version of the fluid delivering system Unity 85DP provided by TEL Corporation. The system is capable of sensing abnormal pressure buildup in the pipeline and terminating any ongoing operation inside a processing chamber. Moreover, the system is capable of delivering most types of gases and liquids to a processing station.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A fluid delivering system for coupling with a supply device, an operational device and an extraction device, comprising:

a main pipeline system that takes in a fluid from the supply device, transfers the fluid to the operational device for reaction and then dumps used fluid into the extraction device, wherein the main pipeline system further includes:

a first flow valve coupled to the supply device to control an input of fluid into the main pipeline system;

a first flow controller coupled to the first flow valve to control a fluid flow rate;

a second flow valve coupled to the first flow controller and the operational device to control fluid feedback;

a first pressure gauge to detect any variation of fluid pressure inside the pipeline;

a third flow valve coupled to the second flow valve, the first pressure gauge and the operational device to protect the pressure gauge;

a first pressure controller to control fluid pressure;

a fourth flow valve coupled to the second flow valve, the third flow valve, the operational device and the first pressure controller to control a flow of fluid to the first pressure controller; and a fifth flow valve coupled to the first pressure controller and the extraction device to control an outflow of fluid to the extraction device;

and at least a secondary pipeline system, wherein the secondary pipeline system also takes in a fluid from the supply device, transfers the fluid to the operational device for reaction and then dumps used fluid into the extraction device, wherein each secondary pipeline system further includes:

a sixth flow valve coupled to the supply device to control an input of fluid into the secondary pipeline system;

a second flow controller coupled to the sixth flow valve to control a fluid flow rate;

a seventh flow valve coupled to the second flow controller and the operational device to control fluid feedback;

a second pressure gauge to detect any variation of fluid pressure inside the pipeline;

an eighth flow valve coupled to the seventh flow valve, the second pressure gauge and the operational device to protect the pressure gauge;

a second pressure controller to control a fluid pressure;

a ninth flow valve coupled to the seventh flow valve, the eighth flow valve, the operational device and the second pressure controller to control the flow of fluid to the second pressure controller; and a tenth flow valve coupled to the second pressure controller and the extraction device to control the outflow of fluid to the extraction device.

2. The system of claim 1, wherein the fluid is a gas.

3. The system of claim 2, wherein the gas is an inert gas.

4. The system of claim 3, wherein the inert gas is helium.

5. The system of claim 4, wherein the reaction in the operational device includes cooling a back surface of silicon wafer with helium to prevent materials on the silicon wafer from overheating.

6. The system of claim 1, wherein the extraction device is a pump.

* * * * *